United States Patent
Lu et al.

[11] Patent Number: 6,165,276
[45] Date of Patent: Dec. 26, 2000

[54] APPARATUS FOR PREVENTING PLASMA ETCHING OF A WAFER CLAMP IN SEMICONDUCTOR FABRICATION PROCESSES

[75] Inventors: Wen-Chuan Lu; Chung-Chien Lu; Chih-Houng Chou; Gary Lin, all of Hsin-chu, Taiwan

[73] Assignee: United Microelectronics Corp., Hsin-Chu, Taiwan

[21] Appl. No.: 09/398,732

[22] Filed: Sep. 17, 1999

[51] Int. Cl.[7] .............................. C23C 16/00; C23C 16/04
[52] U.S. Cl. ............................................. 118/728; 156/345
[58] Field of Search .................................... 118/721, 728, 118/723 E, 500, 503; 156/345; 269/21

[56] References Cited

U.S. PATENT DOCUMENTS

| | | | |
|---|---|---|---|
| 4,842,683 | 6/1989 | Cheng et al. ............................. | 156/345 |
| 5,262,029 | 11/1993 | Erskine et al. ...................... | 204/298.15 |
| 5,292,399 | 3/1994 | Lee et al. ................................. | 156/345 |
| 5,354,382 | 10/1994 | Sung et al. ........................ | 118/723 MR |
| 5,534,110 | 7/1996 | Lenz et al. ............................... | 156/345 |
| 5,569,350 | 10/1996 | Osada et al. ............................. | 156/345 |
| 5,885,428 | 3/1999 | Kogan ................. | 204/298.15 |
| 6,007,673 | 12/1999 | Kugo et al. .............................. | 156/345 |

*Primary Examiner*—Gregory Mills
*Assistant Examiner*—Sylvia R MacArthur
*Attorney, Agent, or Firm*—Harness, Dickey & Pierce, P.L.C.

[57] ABSTRACT

An apparatus for preventing plasma etching wafer clamp is disclosed in a process chamber. The apparatus comprises a pedestal, a bottom electrode, a wafer clamp, a semiconductor wafer, a quartz ring, a top electrode, a cooling plate, a anodize, and a gas hole. The wafer clamp is used to secure the semiconductor wafer. However, the wafer clamp includes a clamp ring, a concave holder, and a depression. The clamp ring is used to support the semiconductor wafer. The concave holder has a semi-elliptical surface, polymer being formed on the backside of the concave holder to prevent plasma etching in the deposition or etching process, into the clamp ring. Then The depression is designed, higher position, adjacent the concave holder.

7 Claims, 4 Drawing Sheets

APPARATUS FOR PREVENTING PLASMA ETCHING OF A WAFER CLAMP IN SEMICONDUCTOR FABRICATION PROCESSES

BACKGROUND OF THE INVENTION

1. Field of the Invention

The present invention relates to an apparatus used for preventing plasma etching, and particularly to an apparatus for preventing plasma etching of a wafer clamp in semiconductor fabrication processes.

2. Description of the Prior Art

The fabrication process of semiconductor devices on the semiconductor wafer typically requires the deposition of multiple metal, dielectric, and semiconductor film layers on the surface of a semiconductor wafer. The film layers are typically deposited onto the semiconductor wafer in vacuum chambers. Certain processing operations require the deposition of film layers or the etching of a previously deposited film layer. During these processing steps, one must properly align and secure the wafer in the process chamber in which the desired deposition or etch process is performed.

Generally, the semiconductor wafer is supported in the process chamber. The semiconductor wafer is placed on, and secured to, the upper surface of the wafer clamp prior to the deposition or etch process. FIG. 1 shows a cross-sectional view of a process chamber. The pedestal 10 is supported, having a wafer support surface, in the process chamber. The bottom electrode 15 is positioned on the pedestal 10. The semiconductor wafer 25 is placed on the bottom electrode 15, the semiconductor wafer 25 secured to a wafer clamp 20, using high pressure gas through a gas hole 55 to generate a high vacuum pressure, thereby securing the semiconductor wafer 25. The quartz ring 30 is positioned on the wafer clamp 20. The top electrode structure 50 is placed, including a top electrode 35, a cooling plate 40, and an anode 45, adjacent the quartz ring 30.

FIGS. 2A and 2B are a partial sectional view of the apparatus of FIG. 1, respectively showing a top view and a bottom view of a traditional wafer clamp. The wafer clamp 140 comprises a clamp ring 100, a planar holder 110, a concave holder 120, and a depression 130. The clamp ring 100 includes a tapered surface to receive the semiconductor wafer. The planar holder 110 is placed adjacent the depression 130. The depression 130 is higher position adjacent the planar holder 110. The concave holder 120 is positioned in the planar holder 110.

FIG. 3 is a partial sectional view of the apparatus of FIG. 1, showing a bottom view of a traditional wafer clamp deposited polymer. The polymer 150 is formed, an approximately circular ring having protected function surrounding the clamp ring 180, in the deposition or etching process. However, a portion of the polymer 150 is merely formed on backside of the concave holder. Then the polymer 150 is not formed on the backside of the planar holder. The backside of the planar holder will be etched for plasma to form a etched region 160. Due to the wafer clamp 170 is etched. The wafer clamp 170 will be reduced the lifetime of usage. Thus, this present invention is disclosed by applying novel clamp wafer structure, and improving the disadvantage.

SUMMARY OF THE INVENTION

In accordance with the present invention, an apparatus with wafer clamp is etched for plasma in semiconductor fabrication processes that substantially improve the apparatus structure to overcome the etching of the wafer clamp. In one embodiment, an apparatus for preventing plasma etching of a wafer clamp is disclosed in a process chamber. The apparatus comprises a pedestal, a bottom electrode, a wafer clamp, a semiconductor wafer, a quartz ring, a top electrode, a cooling plate, an anode, and a gas hole. The wafer clamp is used to secure the semiconductor wafer. However, the wafer clamp includes a clamp ring, a concave holder, and a depression. The clamp ring is used to support the semiconductor wafer. The concave holder has a semi-elliptical surface, with polymer being formed on the backside of the concave holder to prevent plasma etching in the deposition or etching process, into the clamp ring. Then the depression is designed, higher position, adjacent the concave holder.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1:
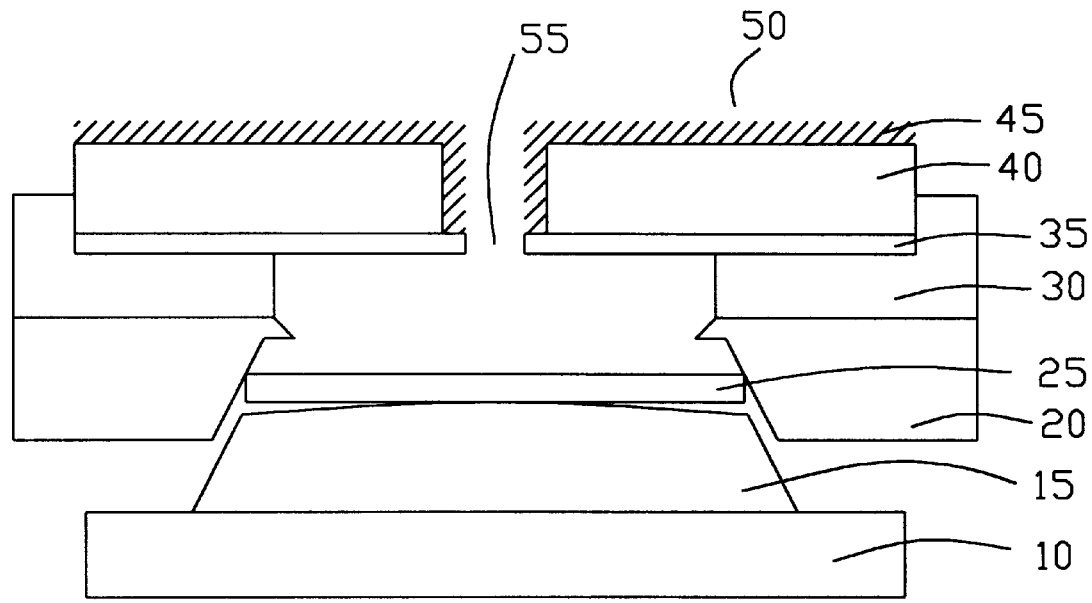
FIG. 1 shows a cross-sectional view of a process chamber.
Figure 2A:
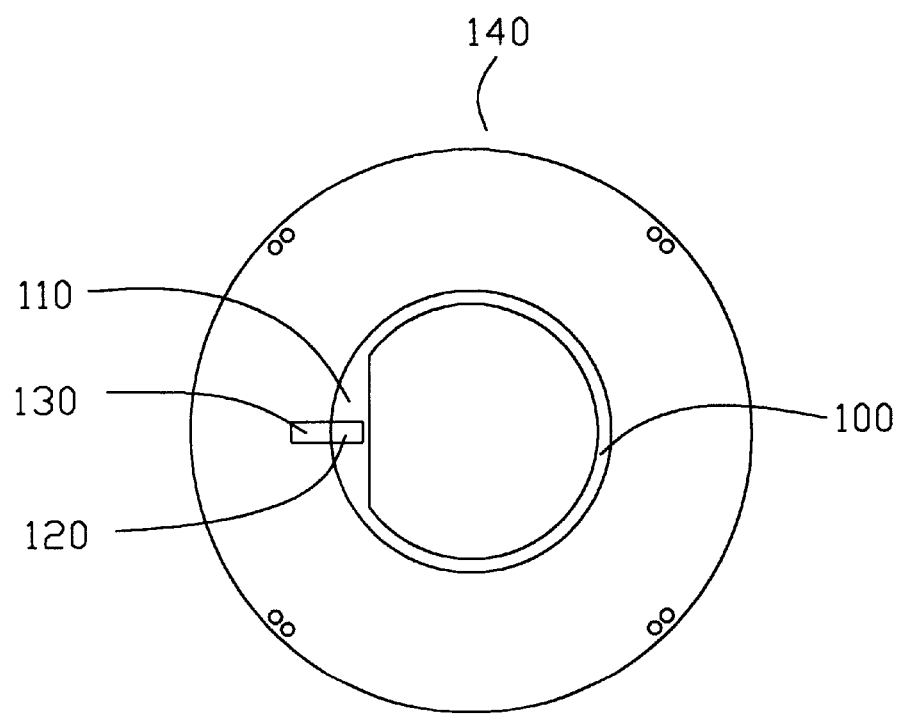
FIGS. 2A and 2B are a partial sectional view of the apparatus of FIG. 1, respectively showing a top view and a bottom view of a traditional wafer clamp.
Figure 2B:
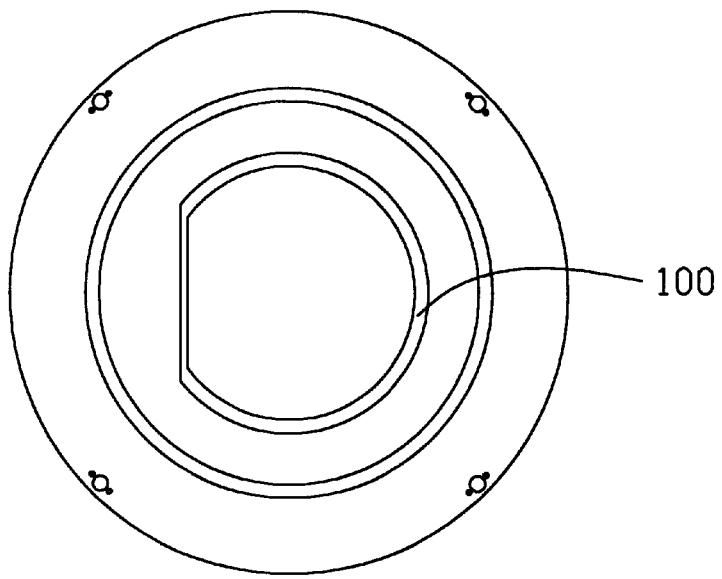
Figure 3:
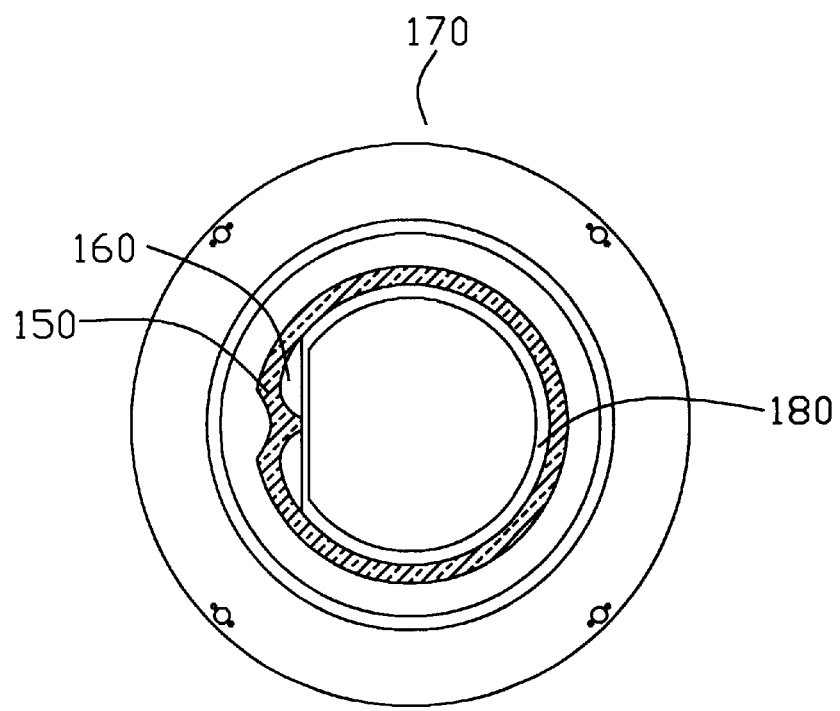
FIG. 3 is a partial sectional view of the apparatus of FIG. 1, showing a bottom view of a traditional wafer clamp deposited polymer.

An apparatus for preventing plasma etching wafer clamp will now be described in detail. In general, the semiconductor wafer is supported in the process chamber. The semiconductor wafer is placed on, and secured to, the upper surface of the wafer clamp prior to the deposition or etch process. FIG. 1 shows a cross-sectional view of a process chamber. The pedestal 10 is supported, having a wafer support surface, in the process chamber. The bottom electrode 15 is positioned on the pedestal 10. The semiconductor wafer 25 is placed on the bottom electrode 15, the semiconductor wafer 25 secured to a wafer clamp 20, using a high pressure gas through a gas hole 55 to generate a high vacuum pressure, thereby securing the semiconductor wafer 25. The quartz ring 30 is positioned on the wafer clamp 20. The top electrode structure 50 is placed, including a top electrode 35, a cooling plate 40, and anode 45, adjacent the quartz ring 30.

Figure 4A:
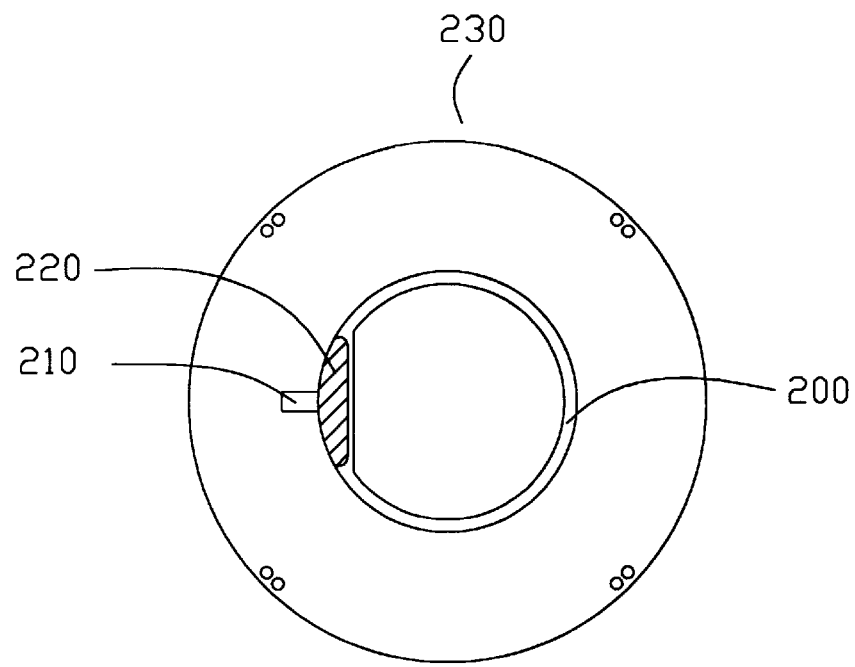
FIGS. 4A and 4B are a partial sectional view of the apparatus of FIG. 1, respectively showing a top view and a bottom view of a wafer clamp in accordance with one embodiment of the present invention.
Figure 4B:
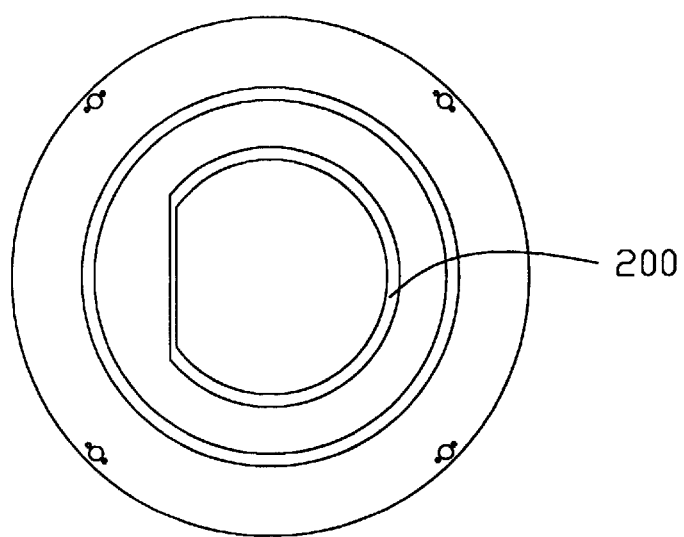

FIGS. 4A and 4B are a partial sectional view of the apparatus of FIG. 1, respectively showing a top view and a bottom view of a wafer clamp in accordance with one embodiment of the present invention. The wafer clamp 230 comprises a clamp ring 200, a concave holder 220, and a depression 210. The clamp ring 200 includes a tapered surface to receive the semiconductor wafer. The concave holder 220 has a semi-elliptical surface, polymer being formed on the backside of the concave holder 220 to prevent plasma etching in the deposition or etching process, into the clamp ring. The depression 210 is designed, having a depth, adjacent the concave holder 220. The depression 210 above than adjacent the concave holder 220.

Figure 5:
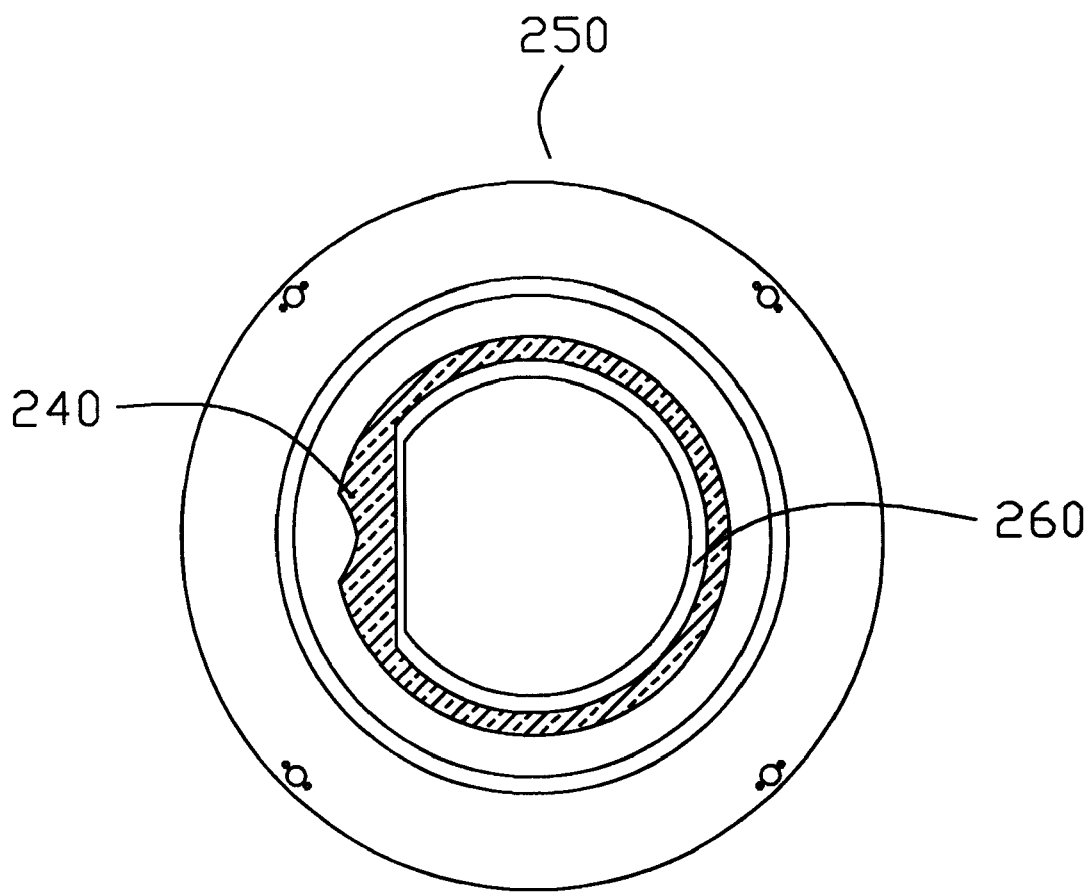
FIG. 5 is a partial sectional view of the apparatus of FIG. 1, showing a bottom view of a wafer clamp deposited polymer in accordance with one embodiment of the present invention.

FIG. 5 is a partial sectional view of the apparatus of FIG. 1, showing a bottom view of a wafer clamp with deposited polymer in accordance with one embodiment of the present invention. The polymer 240 is formed on an approximately circular ring having, protected function surrounding the clamp ring 260, in the deposition or etching process. The backside of the concave holder with edge will not be etched for plasma due to the fact that wafer clamp 250 is protected by the deposited polymer to prevent plasma etching. Therefore, the wafer clamp 250 will be increased the lifetime of usage.

Although specific embodiments have been illustrated and described, it will be obvious to those skilled in the art that various modifications may be made without departing from the spirit which is intended to be limited solely by the appended claims.

What is claimed is:

1. An apparatus for preventing plasma etching of a wafer clamp in semiconductor fabrication processes, said apparatus comprising:

a pedestal within a process chamber having a wafer support surface;

a bottom electrode positioned on said pedestal, a semiconductor wafer being positioned on said bottom electrode, wherein said semiconductor wafer is secured to a wafer clamp, using a high pressure gas through a gas hole to generate high vacuum pressure, thereby securing said semiconductor wafer, wherein said wafer clamp comprises a concave holder having a semi-elliptical surface coated with polymer for plasma etching protection;

a quartz ring positioned on said wafer clamp; and a top electrode structure positioned adjacent said quartz ring.

2. The apparatus according to claim 1, wherein said wafer clamp further comprises a clamp ring, a concave holder, and a depression.

3. The apparatus according to claim 2, wherein said clamp ring comprises a tapered surface to receive said semiconductor wafer.

4. The apparatus according to claim 2, wherein said depression is designed, having a depth, adjacent said concave holder.

5. The apparatus according to claim 4, wherein said depression is located higher position adjacent than said concave holder.

6. The apparatus according to claim 1, wherein said top electrode comprises a top electrode, a cooling plate, and an anode.

7. A wafer clamping apparatus, said apparatus comprising:

a clamp ring placed in a center of said wafer clamping apparatus, having a tapered surface to receive a semiconductor wafer;

a concave holder placed into said clamp ring, having a semi-elliptical surface, polymer being formed on the backside of said concave holder to prevent plasma etching in a deposition process or a etching process; and a depression in said clamp ring placed above said concave holder, having a depth.

* * * * *